(12) United States Patent
Yonekura et al.

(10) Patent No.: US 7,264,681 B2
(45) Date of Patent: Sep. 4, 2007

(54) CLEANING APPARATUS AND CLEANING METHOD

(75) Inventors: Ryosuke Yonekura, Kanagawa-ken (JP); Yukiko Nishioka, Kanagawa-ken (JP); Mitsuo Miyashita, Gunma-ken (JP); Yoshikazu Ariga, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 438 days.

(21) Appl. No.: 10/614,295

(22) Filed: Jul. 8, 2003

(65) Prior Publication Data

US 2004/0065352 A1    Apr. 8, 2004

(30) Foreign Application Priority Data

Jul. 11, 2002  (JP)  ............... 2002-202812

(51) Int. Cl.
*B08B 3/00*  (2006.01)
(52) U.S. Cl. .................. 134/36; 134/27; 134/28; 134/29; 134/26
(58) Field of Classification Search ........... 134/26–29, 134/36, 22.1, 22.18, 902; 438/905, 906
See application file for complete search history.

(56) References Cited

U.S. PATENT DOCUMENTS

| 5,265,632 | A | * | 11/1993 | Nishi ..................... 134/133 |
| 5,923,915 | A | | 7/1999 | Akimoto et al. |
| 6,432,199 | B1 | * | 8/2002 | Takekuma .................. 118/52 |
| 6,494,220 | B1 | | 12/2002 | Matsuda et al. |
| 6,516,815 | B1 | | 2/2003 | Stevens et al. |
| 6,945,259 | B2 | * | 9/2005 | Masui et al. ............. 134/56 R |

FOREIGN PATENT DOCUMENTS

| JP | 363173327 A | * | 7/1988 |
| JP | 08-323302 | | 12/1996 |
| JP | 9-290199 | * | 11/1997 |

* cited by examiner

*Primary Examiner*—M. Kornakov
(74) *Attorney, Agent, or Firm*—Wenderoth, Lind & Ponack, L.L.P.

(57) ABSTRACT

A cleaning apparatus and a cleaning method wherein cleaning and drying can be carried out in the same cleaning apparatus without the risk of reverse contamination of the cleaned object after the drying process. The cleaning apparatus includes a supporting device for supporting an object to be cleaned, and a cleaning cup surrounding the supporting device to prevent splashing of a cleaning liquid. The cleaning apparatus includes a cleaning device for cleaning an inner wall of the cleaning cup with a cleaning liquid.

5 Claims, 9 Drawing Sheets

CLEANING APPARATUS AND CLEANING METHOD

BACKGROUND OF THE INVENTION

The present invention relates to a cleaning apparatus and a cleaning method. More particularly, the present invention relates to a cleaning apparatus and cleaning method suitable for cleaning of substrates requiring a high degree of cleanliness, such as semiconductor substrates, glass substrates, and liquid crystal panels.

With the progress of the technology to fabricate high-integration semiconductor devices in recent years, circuit wiring patterns or interconnections on semiconductor substrates have been becoming small and fine, and distances between wiring patterns have also been decreasing. In the processing of semiconductor substrates, such particles as fine semiconductor particles, dust particles, and crystalline protrusions may adhere to the substrate surface. If particles larger than the distances between wiring patterns remain on the substrate surface, problems such as short-circuiting between wiring patterns occur. Accordingly, particles that may be present on the substrate surface have to be satisfactorily smaller than the distances between wiring patterns. These circumstances also apply to the processing of glass substrates used for masks or the like and the processing of substrates such as liquid crystal panels. In compliance with these demands, a cleaning technique for removing even finer particles, i.e. submicron-level particles, from semiconductor substrates or the like is needed.

The semiconductor substrate is polished in order to make the substrate surface flat. There are publicly known methods of cleaning the polished semiconductor substrate. One of the known cleaning methods is scrub cleaning wherein a rotating substrate is supplied with a cleaning liquid, and while doing so, the substrate is rubbed with a cleaning member comprising a brush, a sponge or the like, thereby the substrate is cleaned. Another known cleaning method is spray cleaning wherein a cleaning liquid is sprayed toward a rotating substrate under the application of ultrasonic vibrational energy or high pressure. The substrate after the completion of the cleaning process is dried, for example, by spinning.

A conventional cleaning apparatus for performing the above-described cleaning process has a supporting device for supporting the substrate, a cleaning cup surrounds the periphery of the supporting device to prevent contamination of the outside of the cleaning cup, which might otherwise be caused by a cleaning liquid splashed by the centrifugal force induced by the rotation of the substrate. The cleaning apparatus further has a cleaning vessel covering the periphery of the cleaning cup.

When the substrate is cleaned by using two different kinds of chemical liquids, two units of cleaning apparatus, i.e. a primary cleaning apparatus and a secondary cleaning apparatus, are juxtaposed with each other. In the primary cleaning apparatus, cleaning using one chemical liquid is carried out. Thereafter, cleaning using the other chemical liquid is performed in the secondary cleaning apparatus. Next, rinsing using pure water is carried out in the secondary cleaning apparatus. Further, drying (e.g. spin drying) is performed in the secondary cleaning apparatus. Thereafter, the substrate is taken out of the secondary cleaning apparatus.

However, when the drying process for the substrate after the secondary cleaning process is carried out in the secondary cleaning apparatus, the substrate may be affected by reverse contamination. Here, the "reverse contamination" means that the cleaned semiconductor substrate is recontaminated with a by-product or the like. That is, when an alkaline chemical (e.g. $NH_4OH$) is used for the chemical liquid cleaning in the primary cleaning apparatus and an acidic chemical (e.g. DHF) is used for the chemical liquid cleaning in the secondary cleaning apparatus, for example, the alkali attached to the substrate transferred into the secondary cleaning apparatus reacts with the newly supplied acid to form the by-product [e.g. $NH_4OH+HF \rightarrow H_2O+NH_4F$ (by-product)]. The by-product adheres to and accumulates on the cleaning cup in the secondary cleaning apparatus and also to the interior of the cleaning vessel therein. The substrate in the secondary cleaning apparatus is rinsed with pure water subsequently. Therefore, the chemical liquids and the by-product are removed from the substrate. However, the by-product and the chemical liquids attached to and accumulated on the inner wall of the cleaning cup and the inner wall of the cleaning vessel, etc. remain attached thereto. Therefore, the remaining by-product and chemical liquids are whirled up by an air flow induced when the substrate is spin-dried, and adhere to the rinsed substrate. In this way, reverse contamination of the substrate occurs (i.e. defects increase).

The above-described problems may be solved by providing a drying apparatus independently in addition to the primary and secondary cleaning apparatuses to dry the rinsed substrate in the contamination-free drying apparatus. However, the use of this method leads to an increase in the installation area due to an increase in size of the system caused by the addition of another processing unit (i.e. a total of three processing units). In addition, the transfer control of the substrate between the three processing units becomes complicated, resulting in a reduction in the transfer throughput.

SUMMARY OF THE INVENTION

The present invention was made in view of the above-described circumstances.

Accordingly, an object of the present invention is to provide a cleaning apparatus and a cleaning method, wherein cleaning and drying can be carried out in the same cleaning apparatus without a risk of reverse contamination of the cleaned object after the drying process.

In a first aspect of the present invention, a cleaning apparatus comprises a supporting device for supporting an object to be cleaned, and a cleaning cup surrounding said supporting device to prevent splashing of a cleaning liquid, said cleaning apparatus comprising: a cleaning device for cleaning an inner wall of said cleaning cup with a cleaning liquid.

In a second aspect of the present invention, the cleaning apparatus further comprises: a cleaning vessel surrounding said cleaning cup; wherein said cleaning device cleans both the inner wall of said cleaning cup and an inner wall of said cleaning vessel.

With this structure, the inner wall of the cleaning cup and the inner wall of the cleaning vessel are cleaned, and thus contaminants attached to these inner walls are surely removed. Accordingly, even if drying is performed in the same cleaning apparatus after the object to be cleaned has been cleaned therein, there is no risk of reverse contamination of the cleaned object by contaminants otherwise remaining attached to the inner wall of the cleaning cup and the inner wall of the cleaning vessel. Therefore, it becomes unnecessary to provide a drying apparatus independently and hence possible to reduce the installation area and also reduce the costs. In addition, the transfer control of the object to be cleaned between the cleaning units becomes simplified. Consequently, the transfer throughput increases.

In third aspect of the present invention, said cleaning device cleans also said supporting device. In forth aspect of the present invention, said cleaning apparatus has a plurality of cleaning devices, and each cleaning device cleans said cleaning cup, cleaning vessel and supporting device, respectively.

With this structure, the supporting device is cleaned, and thus contaminants attached to the supporting device are surely removed. Accordingly, even if drying is performed in the same cleaning apparatus after the object to be cleaned has been cleaned therein, there is no risk of reverse contamination of the cleaned object by contaminants otherwise remaining attached to the supporting device. Therefore, it becomes unnecessary to provide a drying apparatus independently and hence possible to reduce the installation area and also reduce the costs. In addition, the transfer control of the object to be cleaned between the cleaning units becomes simplified. Consequently, the transfer throughput increases.

In fifth aspect of the present invention, cleaning for said object to be cleaned is continued for a predetermined period of time even after completion of cleaning of said cleaning cup, cleaning vessel and supporting device by said cleaning device.

In sixth aspect of the present invention, a cleaning method comprises the steps of: performing chemical liquid cleaning of an object to be cleaned in a cleaning cup; cleaning an inner wall of said cleaning cup, following said chemical liquid cleaning step; rinsing said object to be cleaned; and drying said object to be cleaned in said cleaning cup after said rinsing step.

In seventh aspect of the present invention, a supporting device for supporting said object to be cleaned is also cleaned during said rinsing step. In eighth aspect of the present invention, the cleaning of said object to be cleaned is continued for a predetermined period of time even after completion of cleaning of said cleaning cup and supporting device.

DETAILED DESCRIPTION OF THE INVENTION

Embodiments of the present invention will be described below in detail with reference to the accompanying drawings.

Figure 1:
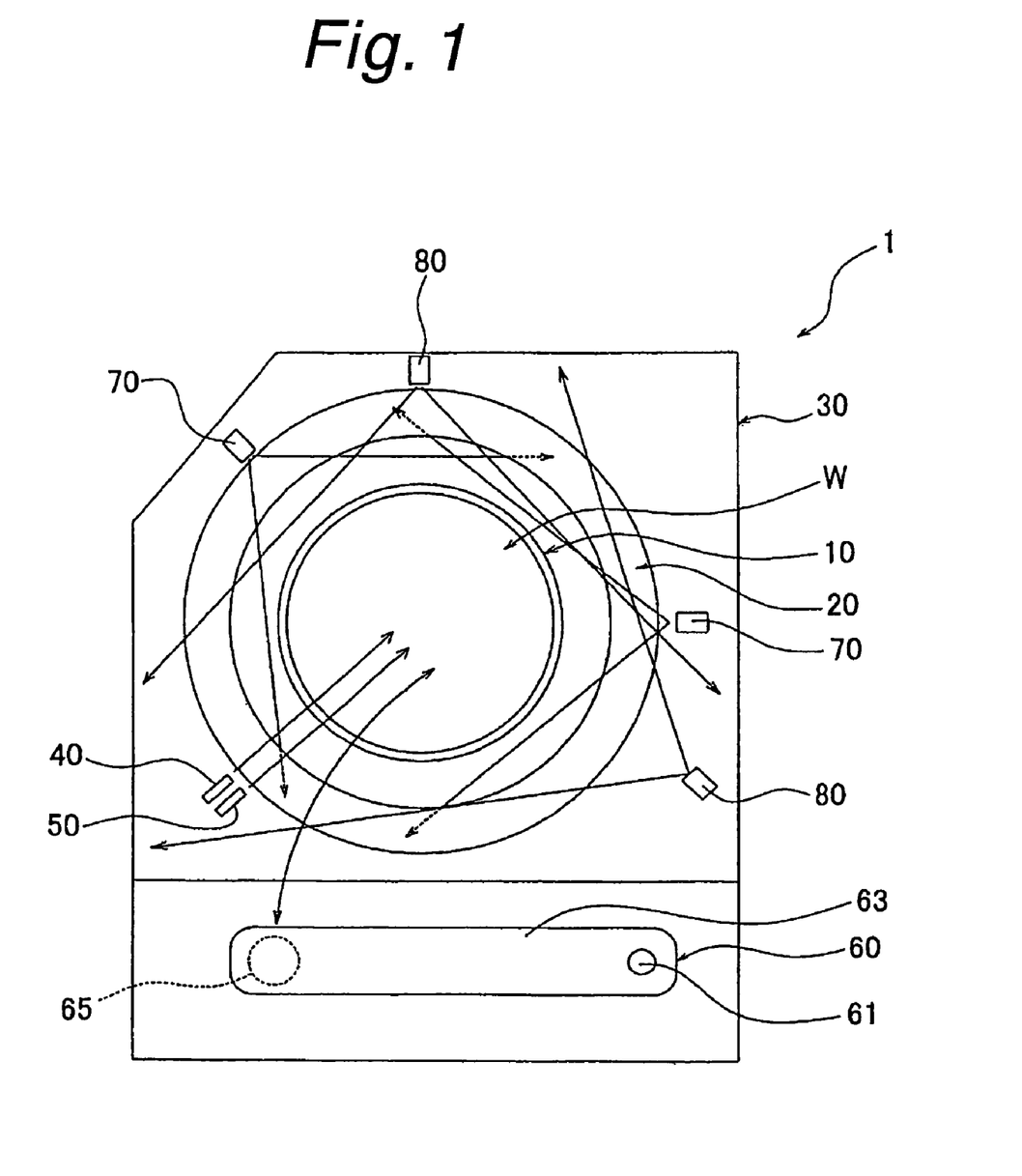
FIG. 1 is a schematic plan view of a cleaning apparatus according to an embodiment of the present invention.
Figure 2:
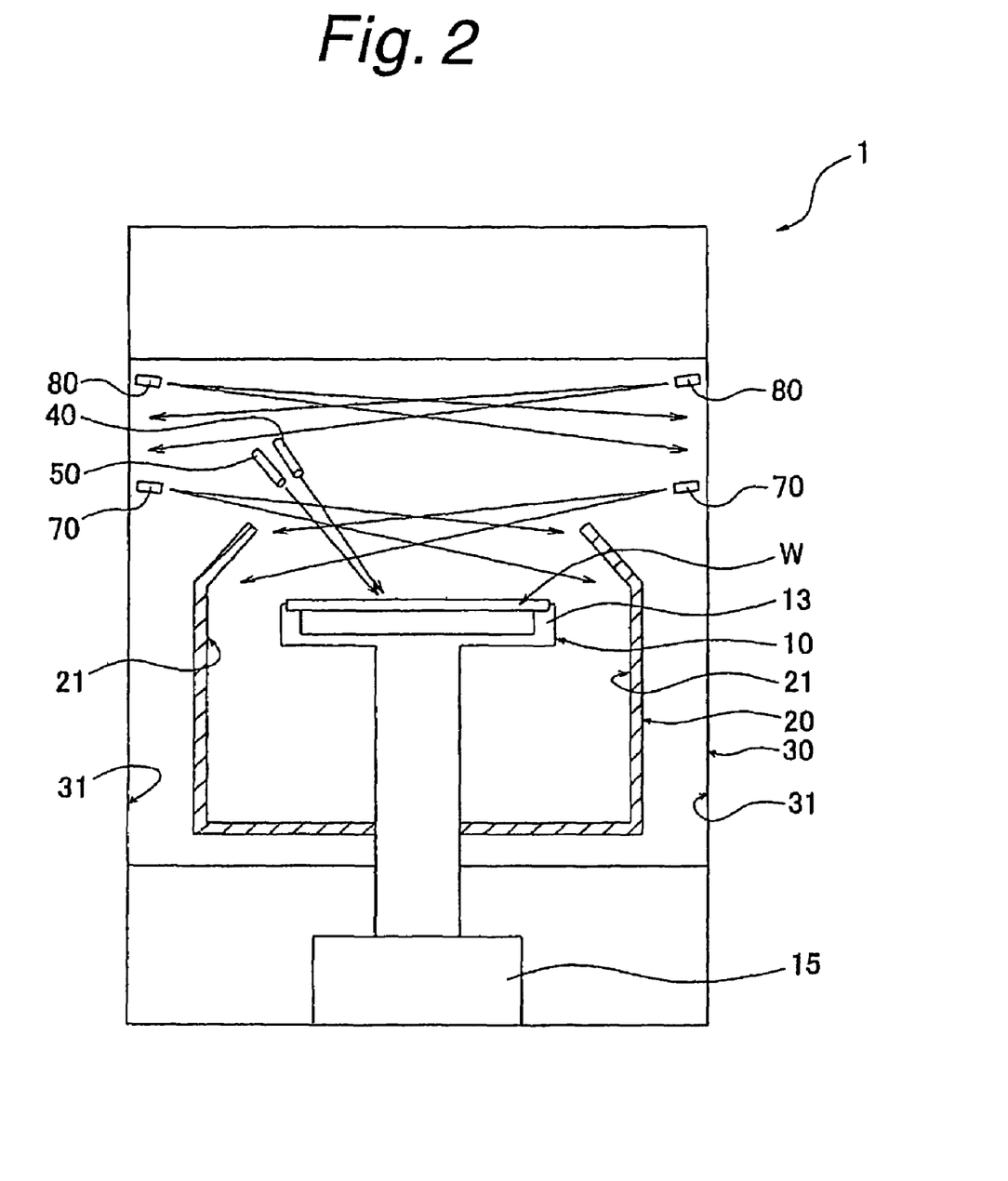
FIG. 2 is a schematic sectional side view of the cleaning apparatus according to the embodiment of the present invention.

FIGS. 1 and 2 show a cleaning apparatus 1 according to an embodiment of the present invention. FIG. 1 is a schematic plan view of the cleaning apparatus 1. FIG. 2 is a schematic sectional side view of the cleaning apparatus 1. As shown in these figures, the cleaning apparatus 1 has a supporting device 10 for supporting a semiconductor substrate W as an object to be cleaned. A cleaning cup 20 is disposed to surround the periphery of the supporting device 10 to prevent splashing of a cleaning liquid. A cleaning vessel 30 is disposed to surround the periphery of the cleaning cup 20. A cleaning device (chemical liquid cleaning device) 40 is installed at a predetermined position in the cleaning vessel 30 to clean the surface of the semiconductor substrate W with a chemical liquid. A cleaning device (rinsing device) 50 is installed at a predetermined position in the cleaning vessel 30 to rinse the surface of the semiconductor substrate W. In addition to the cleaning devices 40 and 50, the cleaning apparatus 1 has cleaning devices 70 installed at predetermined positions in the cleaning vessel 30 to clean the inner wall 21 of the cleaning cup 20. Further, cleaning devices 80 are installed at predetermined positions in the cleaning vessel 30 to clean the inner wall 31 of the cleaning vessel 30. The cleaning apparatus 1 further has a cleaning arm 60 used when the semiconductor substrate W is subjected to scrub cleaning.

The supporting device 10 supports the semiconductor substrate W substantially horizontally in such a manner that the surface to be treated of the semiconductor substrate W faces upward. More specifically, the supporting device 10 is arranged to grip the outer periphery of the semiconductor substrate W with a chuck mechanism 13. The supporting device 10 is driven to rotate by a drive unit 15. The cleaning cup 20 is formed in the shape of a cup, the top of which is open, so as to surround the periphery of the supporting device 10. The cleaning vessel 30 surrounds the cleaning cup 20 to constitute an outer wall of the cleaning apparatus 1. Both the cleaning devices 40 and 50 are of the type that spray a liquid onto the surface of the semiconductor substrate W from liquid spray nozzles. The cleaning device 40 sprays a chemical liquid [for example, an acidic chemical (e.g. DHF) for secondary cleaning]. The cleaning device 50 sprays a rinsing liquid (e.g. pure water).

The cleaning devices 70 and 80 are of the type that spray a cleaning liquid (e.g. pure water) from liquid spray nozzles. The cleaning devices 70 are arranged to spray the cleaning liquid toward the inner wall 21 of the cleaning cup 20. The cleaning devices 80 are arranged to spray the cleaning liquid toward the inner wall 31 of the cleaning vessel 30.

Figure 3:
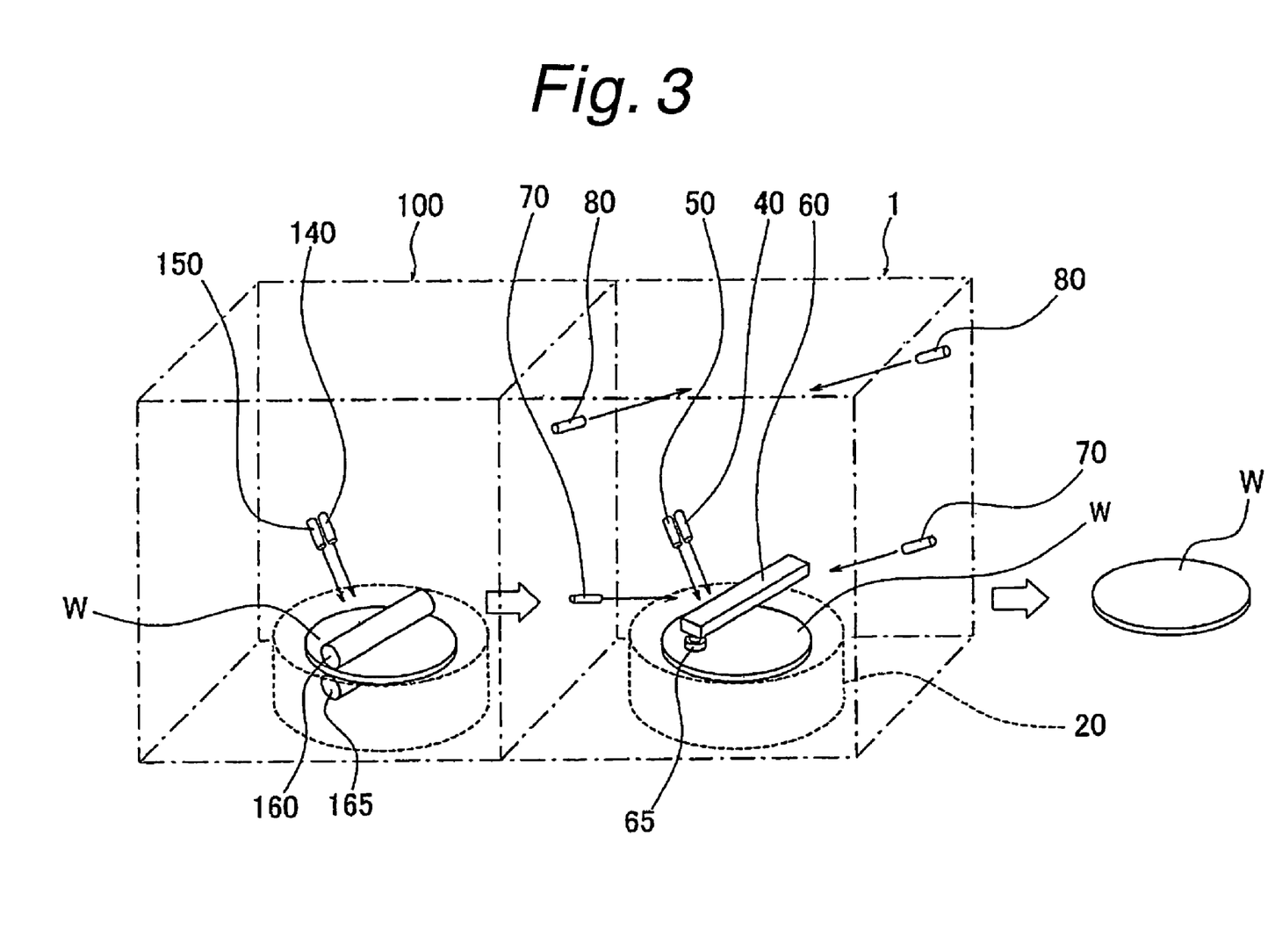
FIG. 3 is a schematic perspective view showing an installation example of cleaning apparatus for performing two different kinds of chemical liquid cleaning on a polished semiconductor substrate.

FIG. 3 is a schematic perspective view showing an installation example of the cleaning apparatus for performing two different kinds of chemical liquid cleaning on a semiconductor substrate W. Here, the semiconductor substrate is polished to make the substrate surface flat. In the cleaning apparatus installation example, a cleaning apparatus (primary cleaning apparatus) 100 and the cleaning apparatus (secondary cleaning apparatus) 1 shown in FIGS. 1 and 2 are juxtaposed with each other. The cleaning apparatus 100 has a cleaning device 140 of the type that sprays a chemical liquid (e.g. NH$_4$OH solution) onto the surface of the semiconductor substrate W from a liquid spray nozzle. The cleaning apparatus 100 further has a cleaning device 150 of the type that sprays a rinsing liquid (e.g. pure water) onto the surface of the semiconductor substrate W from a liquid spray nozzle. Further, the cleaning apparatus 100 has an upper roll sponge 160 and a lower roll sponge 165 that are used when the semiconductor substrate W is subjected to scrub cleaning.

Figure 4:
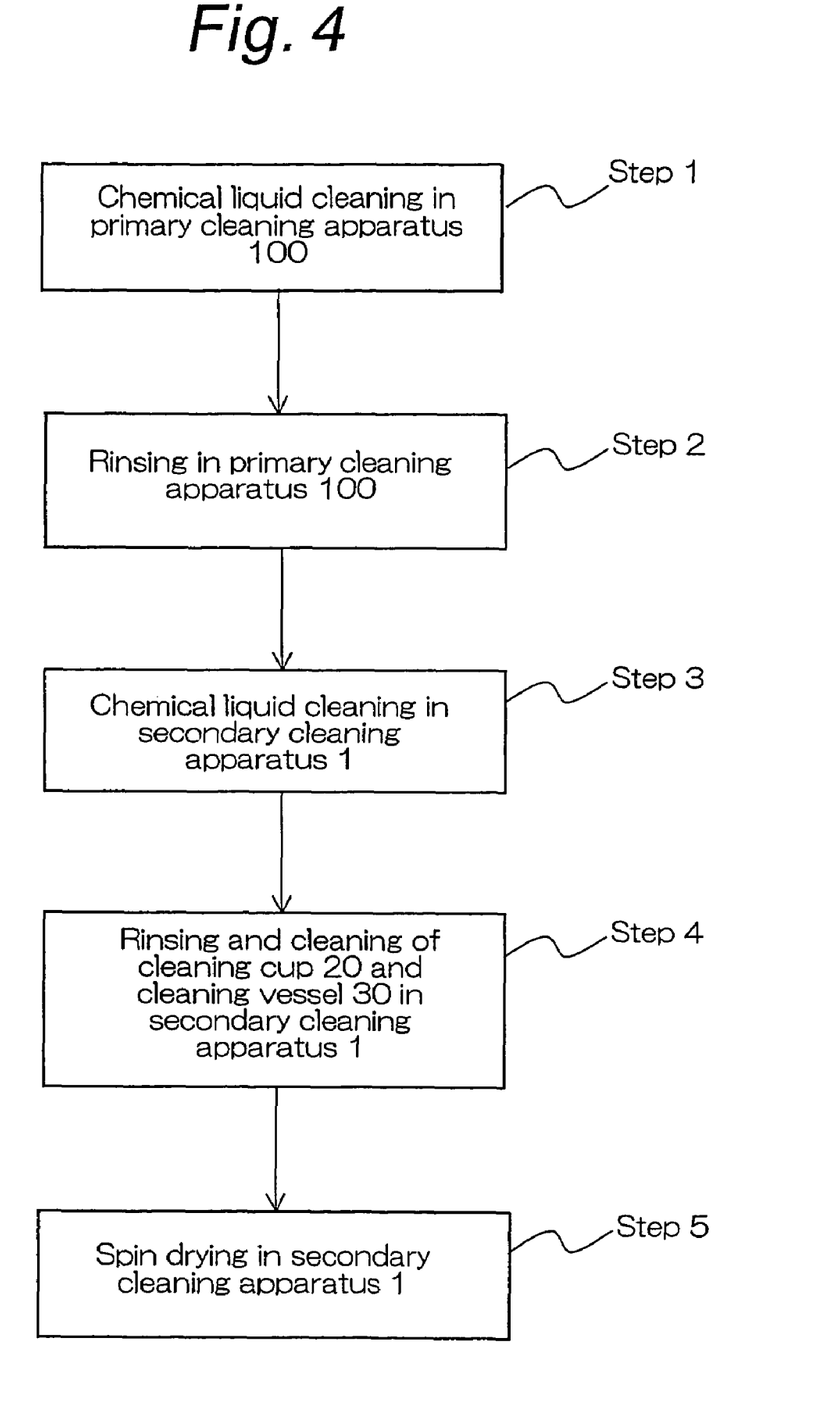
FIG. 4 is a flowchart showing a cleaning process according to the present invention.

FIG. 4 is a flowchart of the cleaning process carried out in the cleaning apparatus installation example shown in FIG. 3. Each step of the cleaning process will be described below.

[Step 1]

First, a polished semiconductor substrate W is transferred into the cleaning apparatus 100. While the semiconductor substrate W is being rotated, the surface thereof is sprayed with a chemical liquid supplied from the cleaning device 140 to perform chemical liquid cleaning. At this time, scrub cleaning may be performed with the upper roll sponge 160 and the lower roll sponge 165 by rotating and causing them to rub against the surfaces of the semiconductor substrate W.

[Step 2]

After the supply of the chemical liquid from the cleaning device 140 has been stopped, the surface of the semiconductor substrate W, which is being rotated, is sprayed with a rinsing liquid from the cleaning device 150 to perform rinsing. At this time, scrub cleaning may be performed with the upper roll sponge 160 and the lower roll sponge 165 by rotating and causing them to rub against the surfaces of the semiconductor substrate W.

[Step 3]

After the supply of the rinsing liquid from the cleaning device 150 has been stopped, the semiconductor substrate W is transferred from the cleaning apparatus 100 into the cleaning apparatus 1 and held on the supporting device 10 shown in FIGS. 1 and 2. Next, the semiconductor substrate W held on the supporting device 10 is driven to rotate by the drive unit 15. Then, the surface of the semiconductor substrate W is sprayed with a chemical liquid (DHF solution) from the liquid spray nozzle of the cleaning device 40 to perform chemical liquid cleaning. At this time, scrub cleaning may be performed by rubbing the rotating sponge 65 against the surface of the semiconductor substrate W by pivotally moving the cleaning arm 60. At this time, a by-product (NH$_4$F) may be produced by a chemical reaction of the chemical liquid used in the cleaning apparatus 100 and carried into the cleaning apparatus 1 and the chemical liquid sprayed from the cleaning device 40. The by-product may adhere not only to the surface of the semiconductor substrate W but also to the inner wall 21 of the cleaning cup 20 and to the inner wall 31 of the cleaning vessel 30 by the rotation of the semiconductor substrate W or the action of an air flow in the apparatus.

[Step 4]

After the supply of the chemical liquid from the cleaning device 40 has been stopped, a rinsing liquid (pure water) is sprayed from the liquid spray nozzle of the cleaning device 50 to rinse the surface of the semiconductor substrate W. At this time, scrub cleaning may be performed by rubbing the rotating sponge 65 against the surface of the semiconductor substrate W by pivotally moving the cleaning arm 60. At the same time as the rinsing is carried out, a cleaning liquid (pure water) is sprayed from the liquid spray nozzles of the cleaning devices 70 and 80 to clean the inner wall 21 of the cleaning cup 20 and the inner wall 31 of the cleaning vessel 30. Consequently, not only the chemical liquids and the by-product attached to the semiconductor substrate W but also the chemical liquids and the by-product attached to the inner wall 21 of the cleaning cup 20 and the inner wall 31 of the cleaning vessel 30 are surely removed. Regarding the spray of the cleaning liquid from the cleaning devices 70 and 80, spraying the cleaning liquid under the application of a certain fluid pressure is more effective for washing off the chemical liquids and the byproduct attached to the inner wall 21 of the cleaning cup 20 and the inner wall 31 of the cleaning vessel 30 than merely spraying the cleaning liquid or the falling down supplying of the cleaning liquid from the liquid spray nozzles. The fluid pressure to be applied to the cleaning liquid is preferably 0.1 (Mpa) or more. However, a fluid pressure of at least 0.05 (Mpa) is suitably used.

Regarding the timing of the cleaning of the inner wall 21 of the cleaning cup 20 and the inner wall 31 of the cleaning vessel 30, it is only essential to perform the inner wall cleaning process when the chemical liquid is not supplied. Usually, the inner wall cleaning process is carried out at the same time as the semiconductor substrate W is rinsed, as stated above. However, it is desirable that the supply of the rinsing liquid to the semiconductor substrate W from the cleaning device 50 should be continued for a while even after the spray of the cleaning liquid onto the cleaning cup 20 and the cleaning vessel 30 has been stopped in order that the cleaning liquid sprayed onto the cleaning cup 20 and the cleaning vessel 30 and included with the by-product does not adhere to the semiconductor substrate W and become dried thereon. It is also possible to clean the inner wall 21 of the cleaning cup 20 and the inner wall 31 of the cleaning vessel 30 when no semiconductor substrate W is present in the cleaning cup 20.

[Step 5]

After the supply of the rinsing liquid to the semiconductor substrate W and the spray of the cleaning liquid onto the inner wall 21 of the cleaning cup 20 and the inner wall 31 of the cleaning vessel 30 have been stopped, the semiconductor substrate W is rotated at high speed by the drive unit 15, thereby performing spin drying. At this time, an air flow is induced by the spin of the semiconductor substrate W. However, the inner wall 21 of the cleaning cup 20 and the inner wall 31 of the cleaning vessel 30 have been cleaned with the cleaning liquid, and neither the chemical liquid nor the by-product is attached thereto. Therefore, it is possible to surely prevent reverse contamination of the semiconductor substrate W which might otherwise be caused by contamination of the inner walls 21 and 31. Upon completion of this step, the cleaning process carried out in the cleaning apparatus installation example shown in FIG. 3 is completed.

Figure 5:
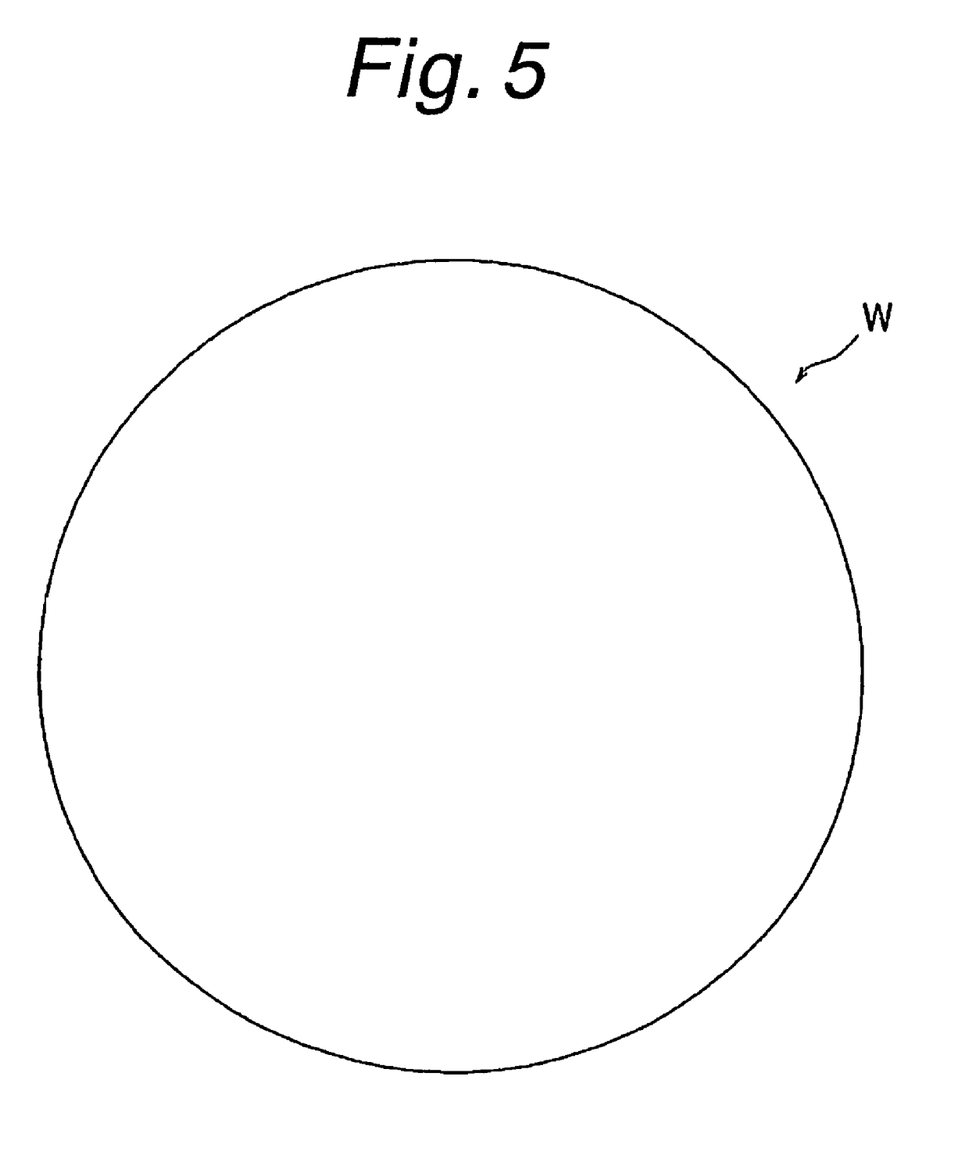
FIG. 5 is a diagram showing the surface condition of a semiconductor substrate as taken out of the cleaning apparatus according to the present invention.
Figure 6:
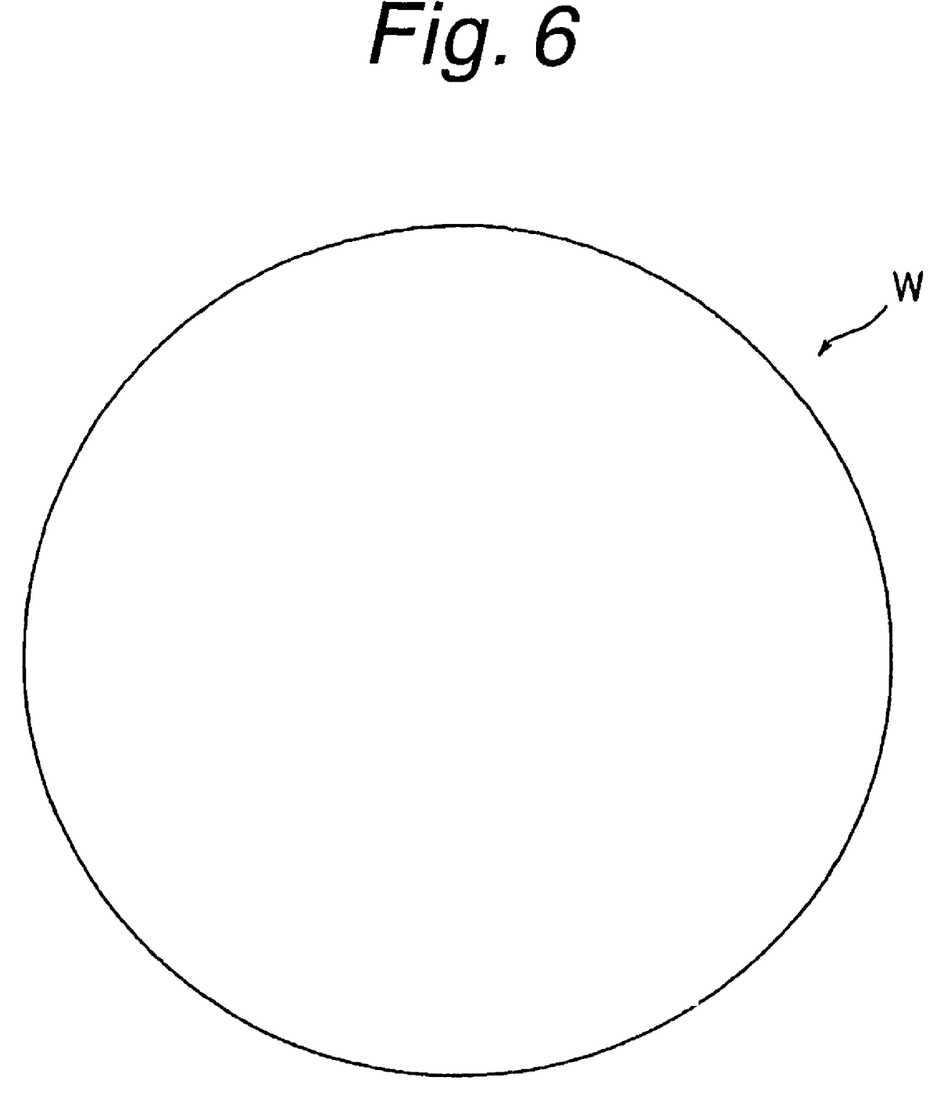
FIG. 6 is a diagram showing the surface condition of a semiconductor substrate taken out of the cleaning apparatus after being cleaned with only cleaning devices for cleaning and rinsing the surface of the semiconductor substrate.

FIG. 5 is a diagram showing the surface condition of the semiconductor substrate W taken out of the cleaning apparatus 1 after being cleaned and dried as stated above. FIG. 6 is a diagram showing the surface condition of the semiconductor substrate W taken out of the cleaning apparatus 1 after being cleaned with only the cleaning devices 40 and 50 without using the cleaning devices 70 and 80. In the two figures, black dots indicate reverse contamination (defects). It will be understood from these figures that reverse contamination is effectively prevented by cleaning the inner wall 21 of the cleaning cup 20 and the inner wall 31 of the cleaning vessel 30 with the cleaning devices 70 and 80.

Figure 7:
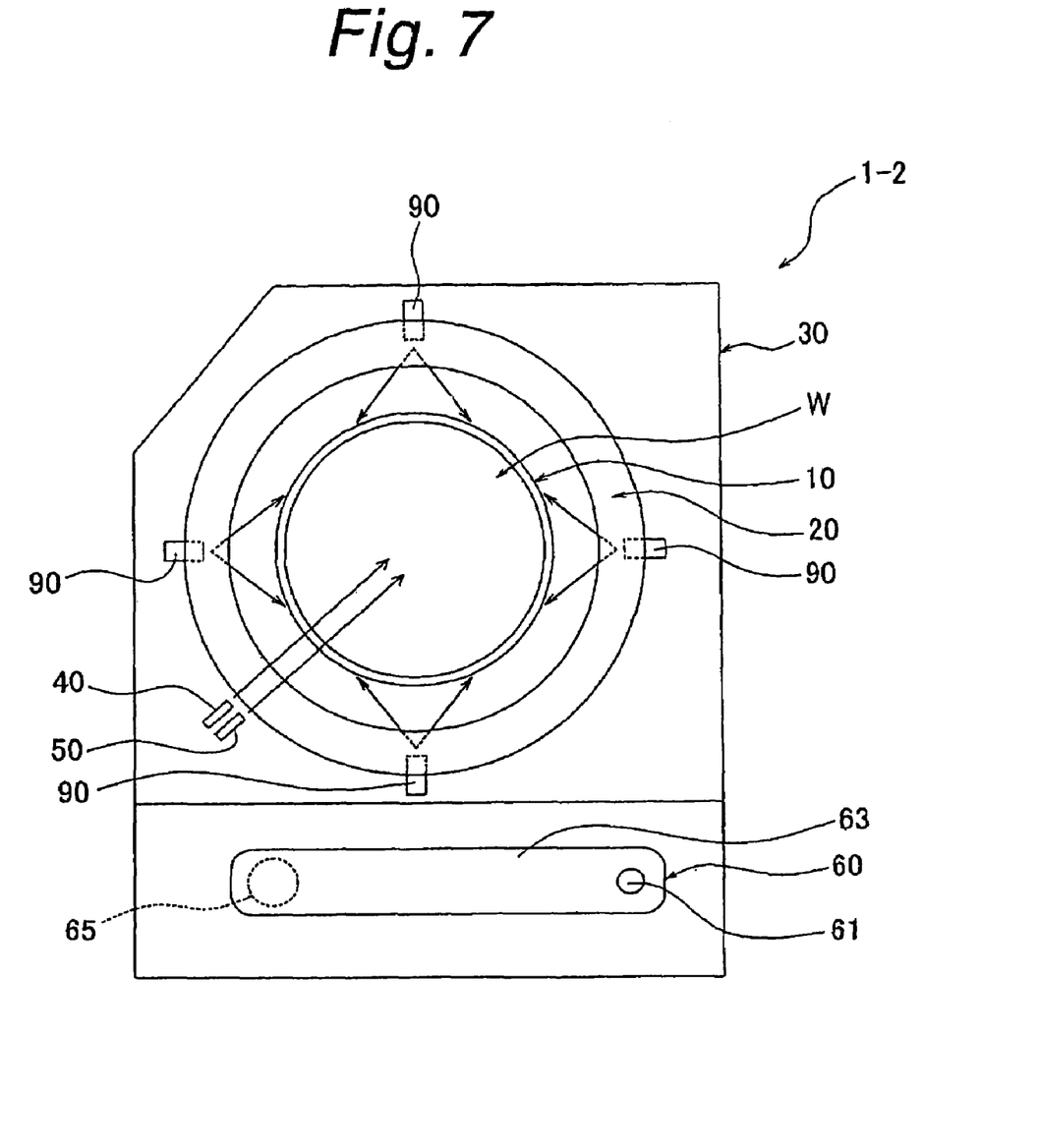
FIG. 7 is a schematic plan view of a cleaning apparatus according to another embodiment of the present invention.
Figure 8:
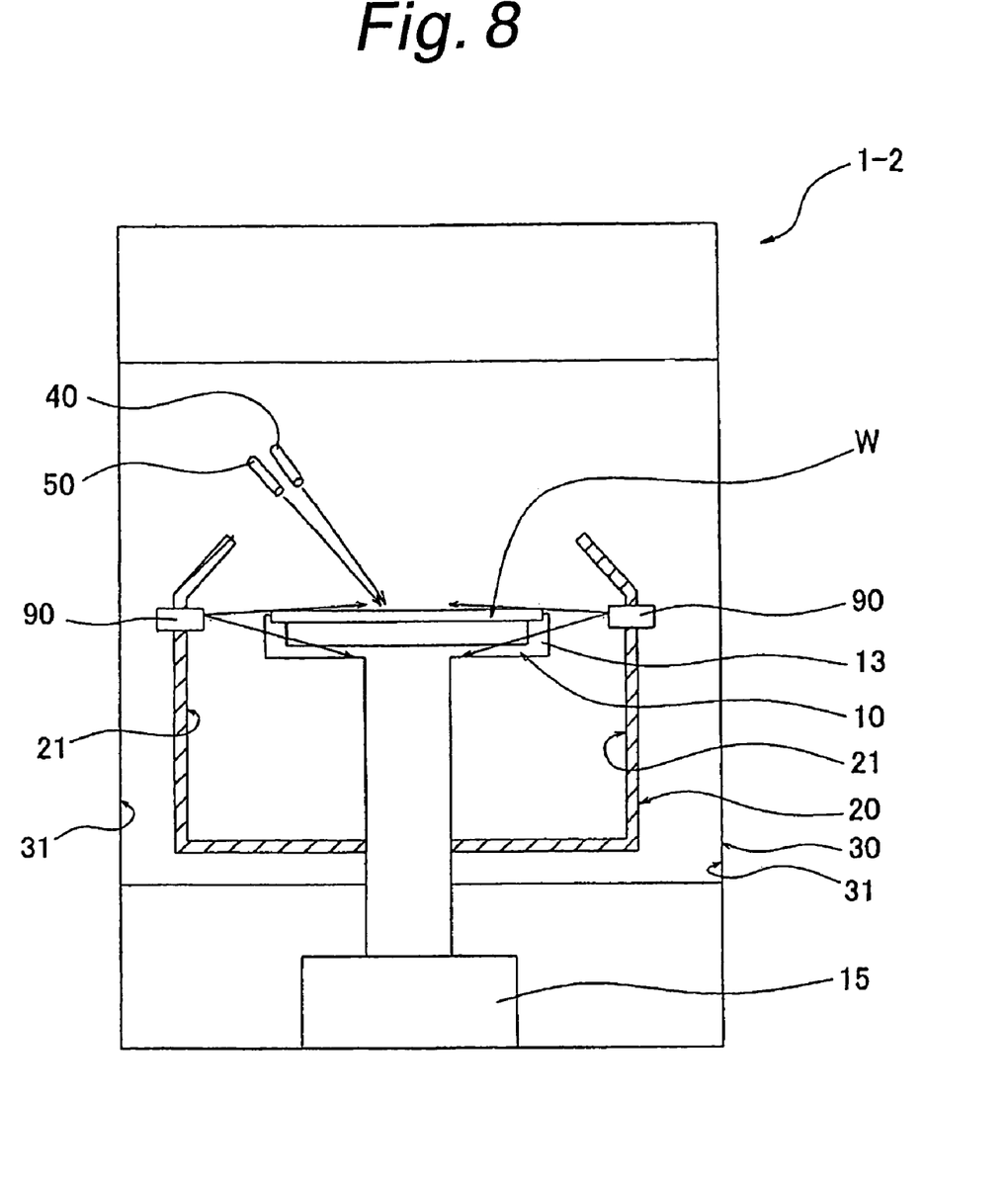
FIG. 8 is a schematic sectional side view of the cleaning apparatus according to the second embodiment of the present invention.

FIGS. 7 and 8 are diagrams showing a cleaning apparatus 1-2 according to another embodiment of the present invention. FIG. 7 is a schematic plan view of the cleaning apparatus 1-2. FIG. 8 is a schematic sectional side view of the cleaning apparatus 1-2. In the cleaning apparatus 1-2, the same portions as those of the cleaning apparatus 1 shown in FIGS. 1 and 2 are denoted by the same reference numerals, and a detailed description thereof is omitted. The cleaning apparatus 1-2 also has a supporting device 10 for supporting a semiconductor substrate W as an object to be cleaned, as in the case of the cleaning apparatus 1. Similarly, a cleaning cup 20 is disposed to surround the periphery of the supporting device 10 to prevent splashing of a cleaning liquid. A cleaning vessel 30 is disposed to surround the periphery of the cleaning cup 20. A cleaning device (chemical liquid cleaning device) 40 is installed at a predetermined position in the cleaning vessel 30 to clean the surface of the semiconductor substrate W with a chemical liquid. A cleaning device (rinsing device) 50 is installed at a predetermined position in the cleaning vessel 30 to rinse the surface of the semiconductor substrate W. The cleaning apparatus 1-2 differs from the cleaning apparatus 1 shown in FIGS. 1 and 2 in that cleaning devices 90 for cleaning the supporting device 10 with a cleaning liquid are provided instead of installing the cleaning devices 70 and 80.

The cleaning devices 90 are of the type that spray a cleaning liquid (e.g. pure water) from liquid spray nozzles. The cleaning devices 90 are provided at four positions, respectively, on the side wall of the cleaning cup 20. The cleaning devices 90 are installed so as to spray a cleaning liquid from the inside of the cleaning cup 20 toward the supporting device 10, particularly toward the chuck mechanism 13 of the supporting device 10.

Figure 9:
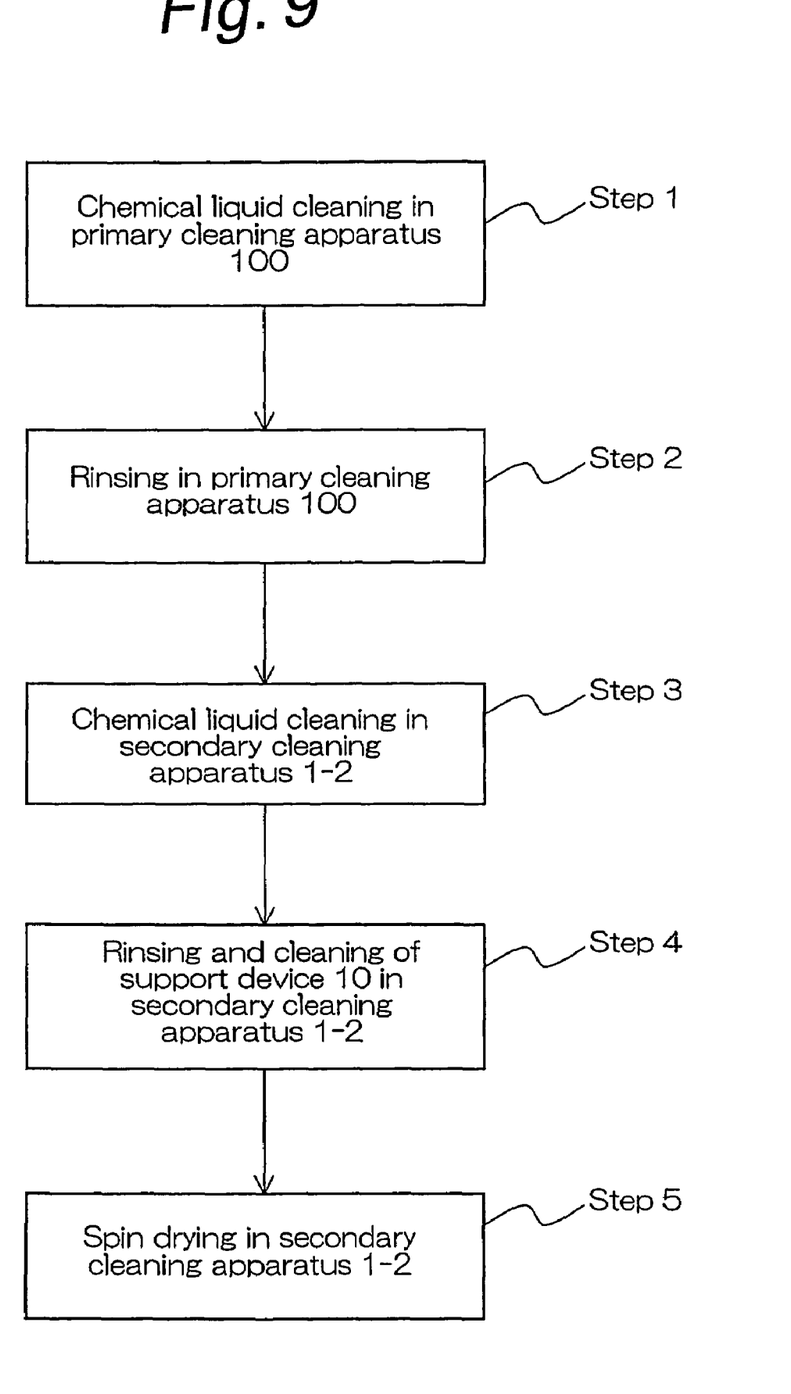
FIG. 9 is a flowchart showing another cleaning process according to the present invention.

The following is a description of a system using the cleaning apparatus 1-2 in place of the secondary cleaning apparatus 1 shown in FIG. 3. It should be noted that the following description will be made on the assumption that the cleaning devices 90 shown in FIGS. 7 and 8 are installed in place of the cleaning devices 70 and 80 in the secondary cleaning apparatus 1 in FIG. 3. FIG. 9 is a flowchart of the cleaning process carried out in this cleaning apparatus installation example. Each step of the cleaning process will be described below.

[Step 1]

First, a polished semiconductor substrate W is transferred into the cleaning apparatus 100. While the semiconductor substrate W is being rotated, the surface thereof is sprayed with a chemical liquid supplied from the cleaning device 140 to perform chemical liquid cleaning. At this time, scrub cleaning may be performed with the upper roll sponge 160 and the lower roll sponge 165 by rotating and causing them to rub against the surfaces of the semiconductor substrate W.

[Step 2]

After the supply of the chemical liquid from the cleaning device 140 has been stopped, the surface of the semiconductor substrate W, which is being rotated, is sprayed with a rinsing liquid from the cleaning device 150 to perform rinsing. At this time, scrub cleaning may be performed with the upper roll sponge 160 and the lower roll sponge 165 by rotating and causing them to rub against the surfaces of the semiconductor substrate W.

[Step 3]

After the supply of the rinsing liquid from the cleaning device 150 has been stopped, the semiconductor substrate W is transferred from the cleaning apparatus 100 into the cleaning apparatus 1-2 and held on the supporting device 10 shown in FIGS. 7 and 8. Next, the semiconductor substrate W held on the supporting device 10 is driven to rotate by the drive unit 15. Then, the surface of the semiconductor substrate W is sprayed with a chemical liquid (DHF solution) from the liquid spray nozzle of the cleaning device 40 to perform chemical liquid cleaning. At this time, scrub cleaning may be performed by rubbing the rotating sponge 65 against the surface of the semiconductor substrate W by pivotally moving the cleaning arm 60. At this time, a by-product ($NH_4F$) may be produced by a chemical reaction of the chemical liquid used in the cleaning apparatus 100 and carried into the cleaning apparatus 1-2 and the chemical liquid sprayed from the cleaning device 40. The by-product may adhere not only to the surface of the semiconductor substrate W but also to the inner wall 21 of the cleaning cup 20 and to the inner wall 31 of the cleaning vessel 30 by the rotation of the semiconductor substrate W or the action of the air flow in the apparatus.

[Step 4]

After the supply of the chemical liquid from the cleaning device 40 has been stopped, a rinsing liquid (pure water) is sprayed from the liquid spray nozzle of the cleaning device 50 to rinse the surface of the semiconductor substrate W. At this time, scrub cleaning may be performed by rubbing the rotating sponge 65 against the surface of the semiconductor substrate W by pivotally moving the cleaning arm 60. At the same time as the rinsing is carried out, a cleaning liquid (pure water) is sprayed from the liquid spray nozzles of the cleaning devices 90 shown in FIGS. 7 and 8 to clean the chuck mechanism 13 and other portions of the supporting device 10. Consequently, not only the chemical liquids and the byproduct attached to the semiconductor substrate W but also the chemical liquids and the by-product attached to the supporting device 10 are surely washed off. Regarding the spray of the cleaning liquid from the cleaning devices 90 also, spraying the cleaning liquid under the application of a certain fluid pressure is effective for washing off the chemical liquids and the by-product attached to the supporting device 10. The fluid pressure to be applied to the cleaning liquid is preferably 0.1 (Mpa) or more. However, a fluid pressure of at least 0.05 (Mpa) is suitably used.

Regarding the cleaning timing for the supporting device 10, it is only essential to perform the supporting device cleaning process when the chemical liquid is not supplied. Usually, the supporting device cleaning process is carried out at the same time as the rinsing of the semiconductor substrate W, as stated above. However, it is desirable that the supply of the rinsing liquid to the semiconductor substrate W from the cleaning device 50 should be continued for a while even after the spray of the cleaning liquid onto the supporting device 10 has been stopped in order that the cleaning liquid sprayed onto the supporting device 10 and included with the by-product does not adhere to the semiconductor substrate W and become dried thereon. It is also possible to clean the supporting device 10 when no semiconductor substrate N is present in the cleaning cup 20.

[Step 5]

After the supply of the rinsing liquid to the semiconductor substrate W and the spray of the cleaning liquid onto the supporting device 10 have been stopped, the semiconductor substrate W is rotated at high speed by the drive unit 15, thereby performing spin drying. At this time, the air flow is induced by the spin of the semiconductor substrate W. However, the supporting device 10 has been cleaned with the cleaning liquid, and neither the chemical liquid nor the by-product is attached thereto. Therefore, it is possible to surely prevent reverse contamination of the semiconductor substrate W which might otherwise be caused by contamination of the supporting device 10. Upon completion of this step, the cleaning process carried out in the cleaning apparatus installation example is completed.

Although the embodiments of the present invention have been described above, it should be noted that the present invention is not necessarily limited to the foregoing embodiments and that various changes and modifications may be imparted thereto without departing from the scope of the invention, which is limited solely by the appended claims, and the technical idea described in the specification and the accompanying drawings. It should be noted that any configuration, structure or material that offers the operation/ working effect of the invention of this application falls within the technical idea of the present invention even if it is not directly stated in the specification or the accompanying drawings. For example, the cleaning of the inner wall 21 of the cleaning cup 20 and the inner wall 31 of the cleaning vessel 30 by the cleaning devices 70 and 80 and the cleaning of the supporting device 10 by the cleaning devices 90 have been described above as different embodiments. However, if the three different kinds of cleaning devices 70, 80 and 90 are incorporated into a single cleaning apparatus to clean the inner wall 21 of the cleaning cup 20, the inner wall 31 of the cleaning vessel 30 and the supporting device 10, reverse contamination of the semiconductor substrate W can be prevented even more effectively.

Although in the foregoing embodiments the present invention has been described with regard to an example in which the cleaning apparatus 1 or 1-2 is used in a cleaning system that performs two different kinds of chemical liquid cleaning on a polished semiconductor substrate W as shown in FIG. 3, the cleaning apparatus 1 or 1-2 may also be used in a cleaning system that performs three or more different kinds of chemical liquid cleaning. When a plurality of different kinds of chemical liquids are used to perform cleaning in respective cleaning apparatuses, if the cleaning apparatus 1 or 1-2 according to the present invention is used as the cleaning apparatus in the final stage (or in an intermediate stage as occasion demands), the semiconductor substrate W is prevented from being contaminated with any contaminant generated in any cleaning step carried out in the cleaning system from the first stage to the final stage (cleaning apparatus 1 or 1-2). Thus, the semiconductor substrate W free from contaminants is unloaded from the cleaning apparatus 1 or 1-2, advantageously. It should be noted that the cleaning apparatus 1 or 1-2 according to the present invention may be used singly, as a matter of course.

In the embodiment shown in FIGS. 1 and 2, the cleaning devices 70 for cleaning the inner wall 21 of the cleaning cup 20 and the cleaning devices 80 for cleaning the inner wall 31 of the cleaning vessel 30 are installed individually of each other. However, if it is arranged so that a single spray nozzle can spray a cleaning liquid onto the inner wall 21 of the cleaning cup 20 and the inner wall 31 of the cleaning vessel 30 simultaneously, the cleaning devices 70 and 80 may be integrated into a single unit. Although the foregoing embodiments use spin drying as a drying method for the semiconductor substrate W after the cleaning process, other drying methods may also be used, provided that the semiconductor substrate W is dried in the cleaning cup 20. Further, various changes and modifications may be imparted to the support structure for the semiconductor substrate W by the supporting device 10, the configuration and structure of the cleaning cup 20 and the cleaning vessel 30, and so forth.

As has been detailed above, the present invention allows cleaning and drying to be carried out in the same cleaning apparatus without risk of reverse contamination of the cleaned object after the drying process.

Although the present invention has been described above in detail with reference to the drawings, the foregoing description is for explanatory purposes and not intended to limit characteristics. It should be understood that the foregoing description merely illustrates and explains preferred embodiments, and all modifications and changes within the scope of the spirit of the present invention are protected.

The entire disclosure of Japanese Patent Application No. 2002-202812 filed on Jul. 11, 2002 including specification, claims, drawings and summary is incorporated herein by reference in its entirety.

What is claimed is:

1. A cleaning method for cleaning an object in a cleaning vessel comprising:

performing a chemical liquid cleaning operation on the object to be cleaned in a cleaning cup, wherein the cleaning cup is disposed in the cleaning vessel;

simultaneously cleaning, with a cleaning liquid, an inner wall of the cleaning cup by a first nozzle, an inner wall of the cleaning vessel by a second nozzle, and the surface of the object by a third nozzle following said chemical liquid cleaning operation; and continuing said cleaning of the surface of the object with the third nozzle for a predetermined time after completion of said cleaning of the inner wall of the cleaning cup and the cleaning vessel; and drying the object after completion of said cleaning of the surface of the object.

2. A cleaning method according to claim 1, wherein said object is cleaned by a first cleaning liquid and a second cleaning liquid during said chemical liquid cleaning operation.

3. A cleaning method according to claim 2, wherein said first cleaning liquid is an alkaline chemical liquid and said second cleaning liquid is an acidic chemical liquid.

4. A substrate cleaning method comprising:

providing a substrate in a primary cleaning apparatus;

spraying a surface of the substrate with a chemical liquid;

rinsing the surface of the substrate with a rinsing liquid after spraying the surface of the substrate with the chemical liquid;

transferring the substrate to a cleaning cup which is disposed in a cleaning vessel of a secondary cleaning apparatus;

spraying a surface of the substrate with a chemical liquid from a first liquid spray nozzle to perform chemical liquid cleaning;

spraying the surface of the substrate with a rinsing liquid from a second liquid spray nozzle after the chemical liquid cleaning has been performed;

spraying a liquid from a third liquid spray nozzle to clean an inner wall of the cleaning cup after the chemical liquid cleaning has been performed;

spraying a liquid from a fourth liquid spray nozzle to clean an inner wall of the cleaning vessel, wherein liquid is sprayed simultaneously from the second, third and fourth nozzles, and wherein the surface of the substrate is sprayed with the rinsing liquid for a predetermined time after the spraying of the inner wall of the cleaning cup and the inner wall of the cleaning vessel are stopped; and drying the substrate.

5. The substrate cleaning method as claimed in claim 4, wherein the drying operation is performed after the surface of the substrate has been sprayed with the rinsing liquid, and after the inner walls of the cleaning cup and the cleaning vessel have been sprayed with the liquids from the third and fourth spray nozzles.

* * * * *